(12) United States Patent
Kang et al.

(10) Patent No.: US 7,511,538 B2
(45) Date of Patent: Mar. 31, 2009

(54) DATA INPUT BUFFER IN SEMICONDUCTOR DEVICE

(75) Inventors: Hee-Bok Kang, Ichon-shi (KR); Jin-Hong Ahn, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/185,741

(22) Filed: Jul. 21, 2005

(65) Prior Publication Data

US 2006/0220689 A1    Oct. 5, 2006

(30) Foreign Application Priority Data

Mar. 31, 2005    (KR) .................. 10-2005-0027338

(51) Int. Cl.
*H03F 3/45*    (2006.01)
(52) U.S. Cl. ............................. 327/52; 327/51; 327/77; 327/89; 330/252; 330/253; 330/254; 330/256
(58) Field of Classification Search ............... None
See application file for complete search history.

(56) References Cited

U.S. PATENT DOCUMENTS

| | | | | |
|---|---|---|---|---|
| 5,039,878 | A * | 8/1991 | Armstrong et al. | 327/512 |
| 5,369,319 | A * | 11/1994 | Good et al. | 327/73 |
| 5,801,584 | A * | 9/1998 | Mori | 327/543 |
| 5,918,982 | A * | 7/1999 | Nagata et al. | 374/178 |
| 6,169,424 | B1 * | 1/2001 | Kurd | 327/53 |
| 6,531,911 | B1 * | 3/2003 | Hsu et al. | 327/512 |
| 6,768,691 | B2 | 7/2004 | Kumazaki et al. | 365/198 |
| 6,768,697 | B2 | 7/2004 | Labrum et al. | 365/233 |
| 6,876,250 | B2 * | 4/2005 | Hsu et al. | 327/539 |
| 7,033,072 | B2 * | 4/2006 | Aota et al. | 374/178 |
| 7,279,953 | B2 * | 10/2007 | Turvey | 327/432 |
| 2003/0223303 | A1 | 12/2003 | Lamb et al. | 365/230.06 |
| 2004/0066683 | A1 | 4/2004 | Hartmann et al. | 365/200 |

FOREIGN PATENT DOCUMENTS

| | | |
|---|---|---|
| JP | 04-063016 | 2/1992 |
| KR | 10-1995-0012703 | 10/1997 |
| KR | 10-2003-0037456 | 5/2003 |
| KR | 10-2004-0095957 | 11/2004 |

OTHER PUBLICATIONS

Notice of Preliminary Rejection from the Korean Intellectual Property Office, dated Jun. 23, 2006, In counterpart Korean Patent Application No. 2005-0027338.

* cited by examiner

*Primary Examiner*—Tuan T. Lam
*Assistant Examiner*—Hiep Nguyen
(74) *Attorney, Agent, or Firm*—Finnegan, Henderson, Farabow, Garrett & Dunner, L.L.P.

(57) ABSTRACT

A data input buffer in a semiconductor is capable of avoiding operation speed deterioration of the data input buffer due to the temperature condition or process characteristic. The data input buffer in a semiconductor device includes an input detecting unit for detecting logic level of input data by comparing the voltage level of the input data with a reference voltage, a current driving capability adjusting unit for adjusting current driving capability of the input detecting unit based on at least one of temperature condition and process characteristic, and a buffering unit for buffering the output signal from the input detecting unit.

17 Claims, 2 Drawing Sheets

DATA INPUT BUFFER IN SEMICONDUCTOR DEVICE

FIELD OF INVENTION

The present invention relates to a semiconductor design technique; and, more particularly, to a data input buffer in a semiconductor device.

DESCRIPTION OF PRIOR ART

A semiconductor is manufactured based on semiconductor techniques such as silicon wafer processing technique and logic design technique. The final product of the semiconductor manufacturing process is a chip of plastic package form, which has particular logic and function for its purpose. Most of semiconductor chips are mounted on PCB (Printed Circuit Board), which is an important element for system configuration, and are provided with appropriate driving voltage for chip driving.

All the semiconductor devices including a semiconductor memory are operated with input/output of specific purpose signals. That is, it is determined if the semiconductor device will be operated or not with combination of the input signals, and its operation scheme is also determined with the combination. On the other hand, operation result is outputted as output signals. Further, the output signals of a semiconductor device can be used as input signals for another semiconductor device in the same system.

An input buffer is for buffering input signals from the outside of the semiconductor device to apply them into the semiconductor device. Its simplest form is a static input buffer. The static input buffer is formed with an inverter having a PMOS transistor and an NMOS transistor serially coupled between power voltage and ground voltage. The static input buffer is simple but weak to noise, which requires input signal form of large amplitude. That is, swing between logic level high and logic level low is high. Accordingly, the static input buffer is not useful for a device requiring low swing or high operational frequency of the input signal.

To solve this problem, a differential amplifier type input buffer is introduced. The differential amplifier type input buffer is referred to as a dynamic input buffer, compared with the former static input buffer.

FIG. 1 is a circuit diagram of a conventional differential amplifier type input buffer.

Referring to FIG. 1, the conventional differential amplifier type input buffer includes an input detecting unit 10 for detecting logic level of input data IN relative to a reference voltage VREF, and a buffering unit 15 for buffering the output signal from the input detecting unit 10.

Here, the input detecting unit 10 includes an input NMOS transistor Q5 receiving the reference voltage VREF as its gate input, an input NMOS transistor Q6 receiving the input data IN as its gate input, load PMOS transistors Q2, Q3 coupled between the power voltage VDD and the input NMOS transistors Q5, Q6, respectively, for forming a current mirror, a bias NMOS transistor Q7 coupled to the ground voltage VSS and commonly coupled between the input NMOS transistors Q5, Q6, and receiving a clock enable signal CKE, which is an inverted version of /CKE, as its gate input, and two PMOS transistors Q1, Q4 coupled to the load PMOS transistors Q2, Q3 in parallel, respectively, between the power voltage and the input NMOS transistors Q5, Q6, respectively.

On the other hand, the buffering unit 15 includes odd number of CMOS inverters for typically receiving the output signal from the input detecting unit 10 and outputting internal data signal BIN. If the number of inverters are larger than 3, the inverters are serially coupled.

When the input data IN having high potential is applied to an input port, its potential is higher than the reference voltage VREF so that internal nodes in the input detecting unit 10 can perform operations that reflect such a state. Here, the reference voltage VREF is a static voltage having a constant potential(typically VDD/2), and may be provided through particular input pin from the outside of the semiconductor device or may be internally generated within the semiconductor device.

The input NMOS transistor Q5 receiving the reference voltage VREF flows constant current i1. Further, the input NMOS transistor Q6 that is arranged symmetrically to the input NMOS transistor Q5 flows current i2 that is determined depending on potential level of the input data IN. As a result, the input detecting unit 10 determines the potential level of the output node N2 based on quantitative comparison between the current i1 and i2.

First, when the clock enable signal /CKE is activated to logic level low, the bias NMOS transistor Q7 is turned on and the PMOS transistors Q1, Q4 are turned off so that the input buffer can operate normally.

On the other hand, when the clock enable signal /CKE is deactivated to logic level high, the bias NMOS transistor Q7 is turned off to make the input detecting unit 10 disabled, and the PMOS transistors Q1, Q4 are turned on so as to pre-charge a node N1 and the output node N2 to logic level high, which avoids passing-through current generation in the data input buffer, and reduces and current consumption during waiting, even if the input data IN changes.

As there is a recent trend to require low operational voltage and fast operational speed for the semiconductor device, data input buffer performance is focused in connection with signal integrity.

As described above, in the conventional data input buffer, current driving capability varies depending on temperature condition or process characteristic. Typically, the process characteristic is handled as best/typical/worst case. In the worst case, the current driving capability is low and, even if temperature is high, the current driving capability falls off. Such falling-off of current driving capability means corresponding falling-off of operational speed of the data input buffer.

SUMMARY OF INVENTION

It is, therefore, an object of the present invention to provide a data input buffer in a semiconductor capable of avoiding operation speed deterioration of the data input buffer due to the temperature condition or process characteristic.

In accordance with an aspect of the present invention, there is provided a data input buffer in a semiconductor device, which includes an input detecting unit for detecting logic level of input data by comparing the voltage level of the input data with a reference voltage; a current driving capability adjusting unit for adjusting current driving capability of the input detecting unit based on at least one of temperature condition and process characteristic; and a buffering unit for buffering the output signal from the input detecting unit.

In accordance with another aspect of the present invention, there is provided a data input buffer in a semiconductor device, which includes an input detecting unit for detecting logic level of input data by comparing the voltage level of the input data with a reference voltage; a sensing unit for sensing temperature condition or process characteristic; a first current driving capability adjusting unit for adjusting current amount flowing through a data input part of the input detecting unit in response to sensing result of the sensing unit; a second current driving capability adjusting unit for adjusting current amount flowing through a reference voltage input part of the input detecting unit in response to sensing result of the sensing unit; and a buffering unit for buffering the output signal from the input detecting unit.

In accordance with still another aspect of the present invention, there is provided a data input buffer in a semiconductor device, which includes an input detecting unit for detecting logic level of input data by comparing the voltage level of the input data with a reference voltage; a sensing unit for sensing temperature condition and process characteristic; a first current driving capability adjusting unit for adjusting current amount flowing through a data input part of the input detecting unit in response to sensing result of the sensing unit; a second current driving capability adjusting unit for adjusting current amount flowing through a reference voltage input part of the input detecting unit in response to sensing result of the sensing unit; and a buffering unit for buffering the output signal from the input detecting unit.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

In accordance with the present invention, current driving capability of a data input buffer is adjusted by using sensing result that is obtained with a temperature sensor and/or process characteristic sensor. For this purpose, the present invention applies an element for adjusting current amount flowing through a data input part and a reference voltage input part step by step, and an element for making a current control signal from the sensing result. With the present invention, even under worst-case process characteristic or high temperature condition, operation speed deterioration of the data input buffer can be avoided.

Hereinafter, a data input buffer in a semiconductor device in accordance with the present invention will be described in detail referring to the accompanying drawings.

Figure 1:
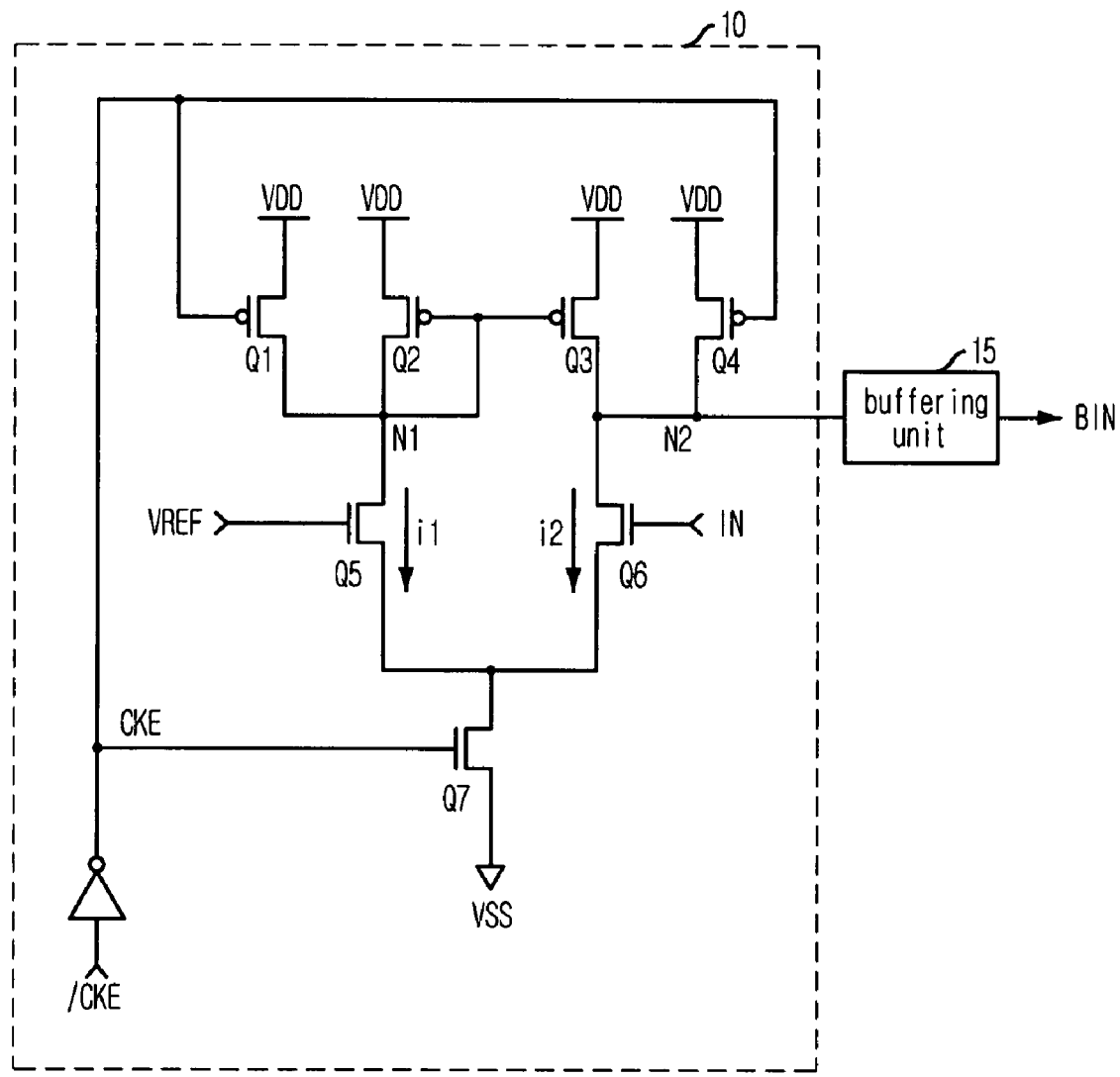
FIG. 1 shows a circuit diagram of a conventional differential amplifier type data input buffer.
Figure 2:
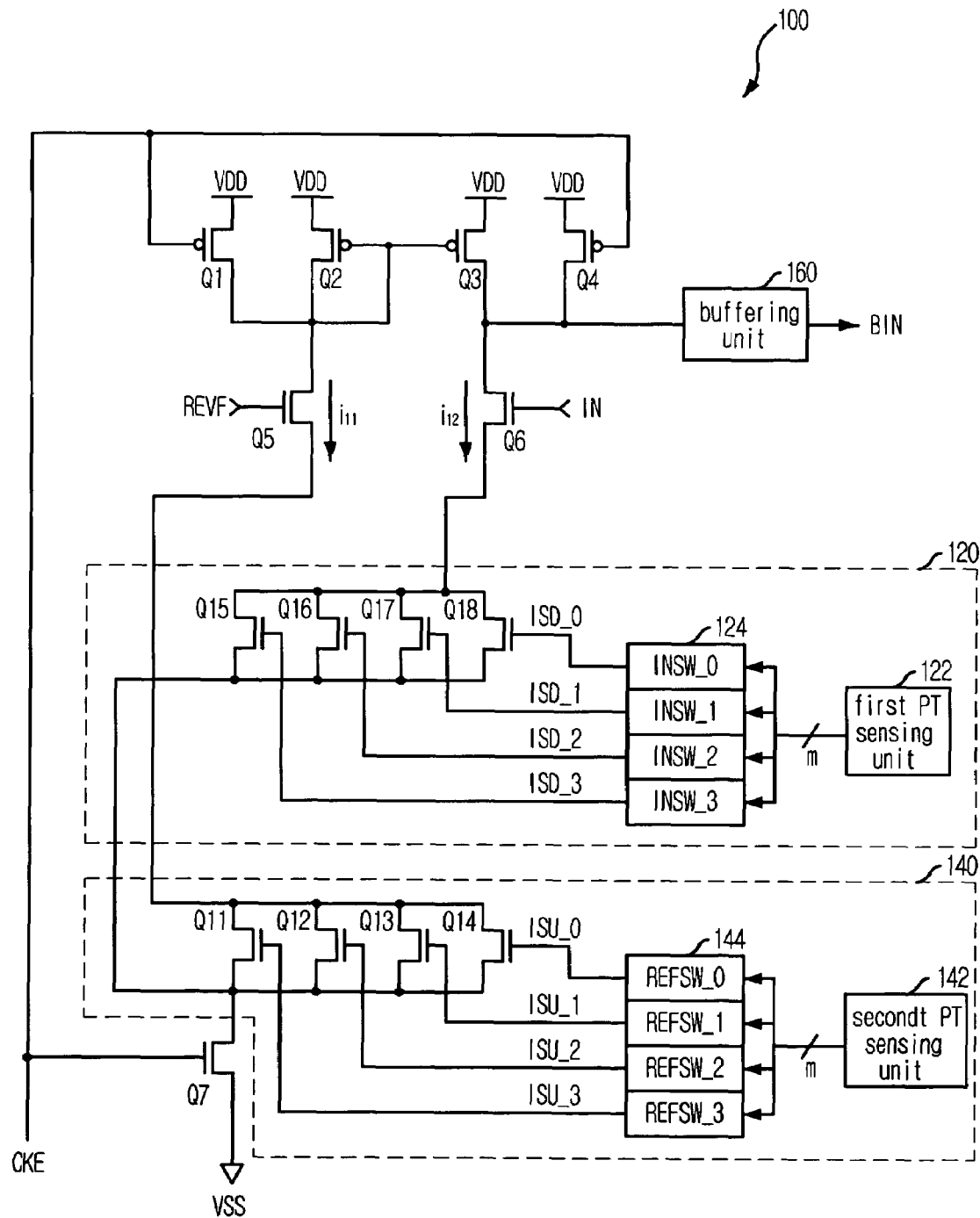
FIG. 2 provides a circuit diagram of a data input buffer in accordance with one embodiment of the present invention.

FIG. 2 provides a circuit diagram of a data input buffer in accordance with one embodiment of the present invention.

Referring to FIG. 2, the data input buffer 100 of the embodiment of the present invention includes an input detecting unit having Q1-Q7 for detecting logic level of input data IN by comparing the voltage level of the input data IN with a reference voltage VREF, a current driving capability adjusting unit 120, 140 for adjusting current driving capability of the input detecting unit based on temperature condition/process characteristic, and a buffering unit 160 for buffering the output signal from the input detecting unit.

In detail, the current driving capability adjusting unit includes a first current driving capability adjusting unit 120 for adjusting current amount flowing through a data input part based on temperature condition/process characteristic, and a second current driving capability adjusting unit 140 for adjusting current amount flowing through a reference voltage input part based on temperature condition/process characteristic.

Here, the first current driving capability adjusting unit 120 is a circuit for adjusting the amount of current i12 flowing through a data input NMOS transistor Q6 step by step, and includes a first PT sensing unit 122 for sensing temperature condition/process characteristic, a first decoder 124 for decoding m-bit output(m is an integer, e.g., m=2) of the first PT sensing unit 122, and a number of driver NMOS transistors Q18, Q17, Q16, Q15 for driving current i12 flowing through the data input NMOS transistor Q6 of the input detecting unit in response to the output signals ISD_0, ISD_1, ISD_2, ISD_3 of the first decoder 124.

Further, the second current driving capability adjusting unit 140 is a circuit for adjusting the amount of current i11 flowing through a reference voltage input NMOS transistor Q5 of the input detecting unit step by step, and includes a second PT sensing unit 142 for sensing temperature condition/process characteristic, a second decoder 144 for decoding m-bit output of the second PT sensing unit 142, and a number of driver NMOS transistors Q14, Q13, Q12, Q11 for driving current i11 flowing through the reference voltage input NMOS transistor Q5 of the input detecting unit in response to the output signals ISU_0, ISU_1, ISU_2, ISU_3 of the second decoder 144.

Here, it is desirable to design the first current driving capability adjusting unit 120 and the second current driving capability adjusting unit 140 to have same size driver NMOS transistors Q11-Q18.

Further, each of the first PT sensing unit 122 and the second PT sensing unit 142 may be implemented with a temperature sensor, process characteristic sensor, and a binary adder for adding the outputs from the two sensors.

On the other hand, the first decoder 124 is a 2×4 decoder that has 4 switching units INSW_0, INSW_1, INSW_2, INSW_3 receiving different combinations of 2-bit output from the first PT sensing unit 122. The second decoder 144 is a 2×4 decoder that has 4 switching units REFSW_0, REFSW_1, REFSW_2, REFSW_3 receiving different combinations of 2-bit output from the second PT sensing unit 142. Here, the switching units can be implemented with NAND gates and the like.

In the following, Tables 1 to 3 provide examples of current driving capability adjustment of the data input part depending on the process characteristic and the temperature condition in the data input buffer as shown in FIG. 2. Referring to Tables 1 to 3, it will be described for the operation of the data input buffer 100 of the embodiment of the present invention.

TABLE 1

| Process Characteristic | Temperature Condition(° C.) | ISD_0 | ISD_1 | ISD_2 | ISD_3 |
|---|---|---|---|---|---|
| Best case | <−10 | H | L | L | L |
|  | −10 to 55 | H | H | L | L |
|  | >55 | H | H | H | L |

TABLE 2

| Process Characteristic | Temperature Condition(° C.) | ISD_0 | ISD_1 | ISD_2 | ISD_3 |
|---|---|---|---|---|---|
| Typical case | <−10 | H | H | L | L |
|  | −10 to 55 | H | H | H | L |
|  | >55 | H | H | H | H |

TABLE 3

| Process Characteristic | Temperature Condition(° C.) | ISD_0 | ISD_1 | ISD_2 | ISD_3 |
|---|---|---|---|---|---|
| Worst case | <−10 | H | H | H | L |
| | −10 to 55 | H | H | H | H |
| | >55 | H | H | H | H |

First, Table 1 shows logic levels for the output signals ISD_0, ISD_1, ISD_2, ISD_3 of the first decoder 124 in the first current driving capability adjusting unit 120 depending on various temperature conditions in the best-case process characteristic. As shown, one transistor Q18 of the driver NMOS transistors Q18, Q17, Q16, Q15 is turned on under low temperature condition(i.e., <−10), two transistors Q18, Q17 are turned on under mid-temperature condition(i.e., −10 to 55), and three transistors Q18, Q17, Q16 are turned on under high temperature condition(i.e., >55). In other words, since current driving capability is secured somehow in the best-case process characteristic, current driving capability can be assured by increasing the number of the turned-on transistors step by step as temperature rises in the best-case process characteristic.

Next, Table 2 shows logic levels for the output signals ISD_0, ISD_1, ISD_2, ISD_3 of the first decoder 124 in the first current driving capability adjusting unit 120 depending on various temperature conditions in the typical-case process characteristic. As shown, two transistors Q18, Q17 of the driver NMOS transistors Q18, Q17, Q16, Q15 are turned on under low temperature condition(i.e., <−10), three transistors Q18, Q17, Q16 are turned on under mid-temperature condition(i.e., −10 to 55), and four transistors Q18, Q17, Q16, Q15 are turned on under high temperature condition(i.e., >55). In other words, since current driving capability is mid-level in the typical-case process characteristic, current driving capability can be assured by turning on more transistors in the typical-case process characteristic than the best-case process characteristic.

Next, Table 3 shows logic levels for the output signals ISD_0, ISD_1, ISD_2, ISD_3 of the first decoder 124 in the first current driving capability adjusting unit 120 depending on various temperature conditions in the worst-case process characteristic. As shown, three transistor Q18, Q17, Q16 of the driver NMOS transistors Q18, Q17, Q16, Q15 are turned on under low temperature condition (i.e., <−10), four transistors Q18, Q17, Q16, Q15 are turned on under mid-temperature condition (i.e., −10 to 55), and four transistors Q18, Q17, Q16, Q15 are turned on under high temperature condition (i.e., >55). In other words, since current driving capability cannot be secured in the worst-case process characteristic, current driving capability can be assured surely by turning on more transistors in the worst-case process characteristic than the typical-case process characteristic. On the other hand, we can see same current driving capability under the mid-temperature condition and the high temperature condition, which corresponds to the maximum according to the number of the driver NMOS transistors Q18, Q17, Q16, Q15 in this embodiment.

As such, in this embodiment, deterioration in current driving capability of the data input part due to worse process characteristic and higher temperature can be avoided.

On the other hand, since the operation according to temperature and process characteristic depends on 2-bit output of the first PT sensing unit 122, 2-bit output value should be made by combining sensing results from the temperature sensor and the process characteristic sensor in the first PT sensing unit 122. One example of the first PT sensing unit 122 among others for realizing Tables 1 to 3 will be described in the following.

The sensing result of the process characteristic sensor in the first PT sensing unit 122 is outputted as '00/01/10' for the best/typical/worst cases, and the sensing result of the temperature sensor is outputted as '00/01/10' for the low/mid/high temperature condition. Then, those two output signals are added to each other in the binary adder of the first PT sensing unit 122.

For example, when the process characteristic is typical and the temperature condition is mid level, both of the output signals of the process characteristic sensor and the temperature sensor are '01' and their added value, i.e., 2-bit output value of the first PT sensing unit 122, is '10'.

The output signal of the first decoder 124 is '1000' when the 2-bit output value of the first PT sensing unit 122 is '00'. The output signal of the first decoder 124 is '1100' when the 2-bit output value of the first PT sensing unit 122 is '01'. The output signal of the first decoder 124 is '1110' when the 2-bit output value of the first PT sensing unit 122 is '10'. The output signal of the first decoder 124 is '1111' when the 2-bit output value of the first PT sensing unit 122 is '11'. Accordingly, in this example, the output signal of the first decoder 124 is '1110' so as to turn on three transistors Q18, Q17, Q16 of the driver NMOS transistors Q18, Q17, Q16, Q15 (see Table 2).

In the following, Tables 4 to 6 provide examples of current driving capability adjustment of the reference voltage input part depending on the process characteristic and the temperature condition in the data input buffer as shown in FIG. 2.

| Process Characteristic | Temperature Condition(° C.) | ISU_0 | ISU_1 | ISU_2 | ISU_3 |
|---|---|---|---|---|---|
| Best case | <−10 | H | L | L | L |
| | −10 to 55 | H | H | L | L |
| | >55 | H | H | H | L |

TABLE 5

| Process Characteristic | Temperature Condition(° C.) | ISU_0 | ISU_1 | ISU_2 | ISU_3 |
|---|---|---|---|---|---|
| Typical case | <−10 | H | H | L | L |
| | −10 to 55 | H | H | H | L |
| | >55 | H | H | H | H |

TABLE 6

| Process Characteristic | Temperature Condition(° C.) | ISU_0 | ISU_1 | ISU_2 | ISU_3 |
|---|---|---|---|---|---|
| Worst case | <−10 | H | H | H | L |
| | −10 to 55 | H | H | H | H |
| | >55 | H | H | H | H |

First, Table 4 shows logic levels for the output signals ISU_0, ISU_1, ISU_2, ISU_3 of the second decoder 144 in the second current driving capability adjusting unit 140 depending on various temperature conditions in the best-case process characteristic. Table 5 shows logic levels for the output signals ISU_0, ISU_1, ISU_2, ISU_3 of the second decoder 144 in the second current driving capability adjusting unit 140 depending on various temperature conditions in the typical-case process characteristic. Table 6 shows logic levels for the output signals ISU_0, ISU_1, ISU_2, ISU_3 of the second decoder 144 in the second current driving capability adjusting unit 140 depending on various temperature conditions in the worst-case process characteristic.

As shown, data in Tables 4 to 6 are equal to those in Tables 1 to 3, and so is the number of the driver NMOS transistors Q14, Q13, Q12, Q11 that are selected under the various conditions. Accordingly, the second PT sensing unit 142 for implementing Tables 4 to 6 can be implemented as same as the first PT sensing unit 122.

As such, since the second PT sensing unit 142 can be implemented as same as the first PT sensing 122, the first current driving capability adjusting unit 120 and the second current driving capability adjusting unit 140 could share one PT sensing unit.

However, in cases, it may be required to control current driving capability of the data input part differently from the reference voltage input part. For this, the output of the first PT sensing unit 122 is made to be different from the second PT sensing unit 142 to adjust current driving capability of the data input part and the reference voltage input part differently.

While the present invention has been described with respect to the particular embodiments, it will be apparent to those skilled in the art that various changes and modifications may be made without departing from the spirit and scope of the invention as defined in the following claims.

For example, while it has been described for one embodiment in which the input detecting unit is implemented with a NMOS type differential amplifier having a current mirror at the power voltage side VDD and a bias transistor at the ground voltage side VSS, the input detecting unit can be implemented with a PMOS type differential amplifier having a current mirror at the ground voltage side VSS and a bias transistor at the power voltage side VDD.

Further, while it has been described for one embodiment in which each of the first and second driving capability adjusting units uses four driver NMOS transistors, PMOS transistors can be used instead of the NMOS transistors, and the number of the driver transistors can be changed.

Further, while the prescribed embodiment uses both of the process characteristic sensor and the temperature sensor, only one of the process characteristic sensor and the temperature sensor can be applied.

As described above, according to the present invention, operation speed deterioration of the data input buffer due to the temperature condition or process characteristic can be avoided and, therefore, reliability of the semiconductor device can be improved.

Though not shown, a data input buffer in a semiconductor device in accordance with another embodiment of the present invention includes a first sensing block having a first temperature sensor for sensing temperature condition, a first process characteristic sensor for sensing process characteristic, and a first binary adder for adding the output of the first temperature sensor to the output of the first process characteristic sensor and a second sensing block having a second temperature sensor for sensing temperature condition, a second process characteristic sensor for sensing process characteristic, and a second binary adder for adding the output of the second temperature sensor to the output of the second process characteristic sensor, wherein the output of the second temperature sensor is different from the output of the first temperature sensor, and the output of the second process characteristic sensor is different from the output of the first process characteristic sensor.

The present application contains subject matter related to Korean patent application No. 2005-27338, filed in the Korean Patent Office on Mar. 31, 2005, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A data input buffer in a semiconductor device, comprising:
   input detecting means for detecting a voltage level of input data by comparing the voltage level of the input data with a voltage level of a reference voltage;
   sensing means for sensing temperature condition or process characteristic;
   first current driving capability adjusting means for adjusting a current amount flowing through a data input part of the input detecting means in response to the result sensed by the sensing means;
   second current driving capability adjusting means for adjusting a current amount flowing through a reference voltage input part of the input detecting means in response to the result sensed by the sensing means; and
   buffering means for buffering an output signal from the input detecting means;
   wherein the sensing means is included in the first current driving capability adjusting means and the second current driving capability adjusting means.

2. The data input buffer in a semiconductor device as recited in claim 1, wherein the sensing means includes:
   first sensing means for sensing temperature condition or process characteristic; and
   second sensing means for sensing temperature condition or process characteristic,
   wherein an output of the second sensing means is different from an output of the first sensing means.

3. The data input buffer in a semiconductor device as recited in claim 2, wherein the first current driving capability adjusting means includes:
   first decoding means for decoding the output of the first sensing means; and
   first driving means having a plurality of first drivers for driving current flowing through the reference voltage input part of the input detecting means in response to an output signal of the first decoding means.

4. The data input buffer in a semiconductor device as recited in claim 3, wherein the second current driving capability adjusting means includes:
   second decoding means for decoding the output of the second sensing means; and
   second driving means having a plurality of second drivers for driving current flowing through the data input part of the input detecting means in response to an output signal of the second decoding means.

5. The data input buffer in a semiconductor device as recited in claim 4, wherein the input detecting means includes:
   the reference voltage input part receiving the reference voltage;
   the data input part receiving the input data;
   a current mirror coupled to the reference voltage input part and the data input part; and
   a bias part for providing a first current path through the reference voltage input part and the first driving means, and a second current path through the data input part and the second driving means, in response to a clock enable signal.

6. The data input buffer in a semiconductor device as recited in claim 5, wherein the first driving means is coupled to the reference voltage input part and the bias part in serial, and includes a plurality of driver NMOS transistors having respective bits of the output signal of the first decoding means as respective gate inputs.

7. The data input buffer in a semiconductor device as recited in claim 6, wherein the second driving means is coupled to the data input part and the bias part in serial, and includes a plurality of driver NMOS transistors having respective bits of the output signal of the second decoding means as respective gate inputs.

8. A data input buffer in a semiconductor device, comprising:
input detecting means for detecting a logic level of input data by comparing a voltage level of the input data with a reference voltage;
sensing means for sensing temperature condition and process characteristic;
first current driving capability adjusting means for adjusting a current amount flowing through a data input part of the input detecting means in response to the result sensed by the sensing means;
second current driving capability adjusting means for adjusting a current amount flowing through a reference voltage input part of the input detecting means in response to the result sensed by the sensing means; and
buffering means for buffering an output signal from the input detecting means;
wherein the sensing means is included in the first current driving capability adjusting means and the second current driving capability adjusting means.

9. The data input buffer in a semiconductor device as recited in claim 8, wherein the sensing means includes:
first sensing means for sensing temperature condition and process characteristic; and
second sensing means for sensing temperature condition and process characteristic,
wherein an output of the second sensing means is different from an output of the first sensing means.

10. The data input buffer in a semiconductor device as recited in claim 9, wherein the first current driving capability adjusting means includes:
first decoding means for decoding the output of the first sensing means; and
first driving means having a plurality of first drivers for driving current flowing through the input data part of the input detecting means in response to an output signal of the first decoding means.

11. The data input buffer in a semiconductor device as recited in claim 10, wherein the second current driving capability adjusting means includes:
second decoding means for decoding the output of the second sensing means; and
second driving means having a plurality of second drivers for driving current flowing through the reference voltage input part of the input detecting means in response to an output signal of the second decoding means.

12. The data input buffer in a semiconductor device as recited in claim 11, wherein the input detecting means includes:
the reference voltage input part receiving the reference voltage;
the data input part receiving the input data;
a current mirror coupled to the reference voltage input part and the data input part; and
a bias part for providing a first current path through the reference voltage input part and the first driving means, and a second current path through the data input part and the second driving means, in response to a clock enable signal.

13. The data input buffer in a semiconductor device as recited in claim 12, wherein the first driving means is coupled to the reference voltage input part and the bias part in serial, and includes a plurality of driver NMOS transistors having respective bits of the output signal of the first decoding means as respective gate inputs.

14. The data input buffer in a semiconductor device as recited in claim 13, wherein the second driving means is coupled to the data input part and the bias part in serial, and includes a plurality of driver NMOS transistors having respective bits of the output signal of the second decoding means as respective gate inputs.

15. The data input buffer in a semiconductor device as recited in claim 8, wherein the sensing means includes:
a temperature sensor for sensing temperature condition;
a process characteristic sensor for sensing process characteristic; and
a binary adder for adding an output of the temperature sensor to an output of the process characteristic sensor.

16. The data input buffer in a semiconductor device as recited in claim 9, wherein the first sensing means includes:
a first temperature sensor for sensing temperature condition;
a first process characteristic sensor for sensing process characteristic; and
a first binary adder for adding an output of the first temperature sensor to an output of the first process characteristic sensor.

17. The data input buffer in a semiconductor device as recited in claim 16, wherein the second sensing means includes:
a second temperature sensor for sensing temperature condition;
a second process characteristic sensor for sensing process characteristic; and
a second binary adder for adding an output of the second temperature sensor to an output of the second process characteristic sensor,
wherein the output of the second temperature sensor is different from the output of the first temperature sensor, and the output of the second process characteristic sensor is different from the output of the first process characteristic sensor.

* * * * *